(12) United States Patent
Koshiishi

(10) Patent No.: US 7,988,814 B2
(45) Date of Patent: Aug. 2, 2011

(54) PLASMA PROCESSING APPARATUS, PLASMA PROCESSING METHOD, FOCUS RING, AND FOCUS RING COMPONENT

(75) Inventor: Akira Koshiishi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 26 days.

(21) Appl. No.: 11/685,308

(22) Filed: Mar. 13, 2007

(65) Prior Publication Data

US 2007/0215279 A1    Sep. 20, 2007

Related U.S. Application Data

(60) Provisional application No. 60/787,217, filed on Mar. 30, 2006.

(30) Foreign Application Priority Data

Mar. 17, 2006   (JP) .................................. 2006-074372

(51) Int. Cl.
*C23F 1/00* (2006.01)
*H01L 21/306* (2006.01)
*C23C 16/00* (2006.01)

(52) U.S. Cl. ................. 156/345.43; 118/723 E

(58) Field of Classification Search ............... 118/715, 118/722, 723 R, 723 E; 156/345.43, 345.44, 156/345.45, 345.46, 345.47

See application file for complete search history.

(56) References Cited

U.S. PATENT DOCUMENTS

| | | | | |
|---|---|---|---|---|
| 6,554,954 B2* | 4/2003 | Ma et al. | ..................... | 156/345.51 |
| 6,887,340 B2* | 5/2005 | Dhindsa et al. | ............ | 156/345.3 |
| 2001/0022293 A1* | 9/2001 | Maeda et al. | ..................... | 216/67 |
| 2002/0029745 A1* | 3/2002 | Nagaiwa et al. | .......... | 118/723 E |
| 2004/0177927 A1* | 9/2004 | Kikuchi et al. | .......... | 156/345.51 |
| 2005/0005859 A1* | 1/2005 | Koshiishi et al. | ............. | 118/728 |
| 2005/0061447 A1 | 3/2005 | Kim et al. | | |
| 2005/0230049 A1 | 10/2005 | Nishio et al. | | |
| 2007/0169891 A1 | 7/2007 | Koshiishi et al. | | |

FOREIGN PATENT DOCUMENTS

| | | |
|---|---|---|
| JP | 2005-277369 | 10/2005 |
| JP | 2005-303099 | 10/2005 |
| KR | 10-2005-0025079 | 3/2005 |

OTHER PUBLICATIONS

U.S. Appl. No. 10/933,383, filed Sep. 3, 2004, Koshiishi, et al.

* cited by examiner

*Primary Examiner* — Maureen Gramaglia

(74) *Attorney, Agent, or Firm* — Oblon, Spivak, McClelland, Maier & Neustadt, L.L.P.

(57) ABSTRACT

When a substrate to be processed placed on a mounting table disposed in a process chamber is processed by plasma generated in the process chamber by application of high-frequency voltage, an electric field causing ions generated by the plasma to accelerate toward a lower surface of a peripheral edge portion of the substrate to be processed placed on the mounting table is formed under the peripheral edge portion of the substrate to be processed, and the ions consequently collide with the lower surface of the peripheral edge portion, which reduces the occurrence of deposition.

17 Claims, 12 Drawing Sheets

PLASMA PROCESSING APPARATUS, PLASMA PROCESSING METHOD, FOCUS RING, AND FOCUS RING COMPONENT

CROSS REFERENCE TO RELATED APPLICATIONS

The present invention contains subject matter related to Japanese Patent Application No. 2006-074372, filed on Mar. 17, 2006 and Provisional Application No. 60/787,217, filed on Mar. 30, 2006, the entire contents of which being incorporated herein by reference.

BACKGROUND OF THE INVENTION

1. Field of the Invention

The present invention relates to a plasma processing apparatus and a plasma processing method for applying plasma processing such as etching to a substrate to be processed such as, for example a semiconductor wafer, and further relates to a focus ring and a focus ring component included in the plasma processing apparatus.

2. Description of the Related Art

Conventionally, a plasma processing apparatus performing plasma processing such as etching by using plasma generated by the application of high-frequency voltage has been in wide use in, for example, manufacturing processes and so on of microscopic electrical circuits in a semiconductor device. In such a plasma processing apparatus, to perform the plasma processing such as etching, a semiconductor wafer is placed in a process chamber whose inside is airtightly sealed, the high-frequency voltage is applied to generate plasma in the process chamber, and the plasma is made to act on the semiconductor wafer.

In some of such plasma processing apparatuses, a ring-shaped member called a focus ring is disposed to surround a periphery of the semiconductor wafer. This focus ring is made of a conductive material such as silicon and purposes of providing the focus ring are: to confine the plasma at the time of, for example, etching of an insulation film; to enable uniform high-quality processing not only in a center portion but also in a peripheral edge portion of the semiconductor wafer by reducing discontinuity of bias potential which is caused in a surface of the semiconductor wafer by an edge effect; and so on.

Further, to enhance processing uniformity in the peripheral edge portion of the semiconductor wafer by this focus ring, the present inventors have disclosed a focus ring whose upper surface of the focus ring has an inclined surface portion surrounding the semiconductor wafer and a horizontal surface portion formed continuously from and on an outer side of the inclined surface portion (see Japanese Patent Application Laid-open No. 2005-277369 (for example, FIGS. 1, 2).

In the invention disclosed in Japanese Patent Application Laid-open No. 2005-277369, owing to the specially designed upper surface of the focus ring, the tilt of an electric field in the peripheral edge portion of the semiconductor wafer is reduced, which enhances uniformity in etching, and a potential difference is generated between the peripheral edge of the semiconductor wafer and an inner circumferential surface of the focus ring, which prevents the plasma from entering an area under the peripheral edge portion of the semiconductor wafer.

SUMMARY OF THE INVENTION

However, even when the entrance of the plasma is thus prevented by the potential difference between the peripheral edge of the semiconductor wafer and the inner circumferential surface of the focus ring, there sometimes occurs so called deposition which is adhesion of CF polymer and the like onto a lower surface of the peripheral edge portion of the semiconductor wafer.

It is an object of the present invention to reduce the adhesion of deposition on a lower surface of a peripheral edge portion of a substrate to be processed such as a semiconductor wafer when the substrate to be processed is plasma-processed.

The present inventors have conducted various studies on causes of the above-described deposition occurring on the lower surface of the peripheral edge portion of the substrate to be processed. As a result, it has been found out that the adhesion of the deposition occurs because of the following reason. That is, in a case where the potential difference is generated between the peripheral edge of the semiconductor wafer and the inner circumferential surface of the focus ring as in the invention disclosed in Japanese Patent Application Laid-open N. 2005-277369, ions in the plasma passing through a gap between the peripheral edge of the semiconductor wafer and the inner circumferential surface of the focus ring are attracted toward either the peripheral edge of the semiconductor wafer or the inner circumferential surface of the focus ring due to the potential difference therebetween and thus do not reach the area under the peripheral edge portion of the substrate to be processed, but plasma products such as CF polymer without any electric charge pass through the gap between the peripheral edge of the semiconductor wafer and the inner circumferential surface of the focus ring as they are to reach the area under the peripheral edge portion of the substrate to be processed. It has been also found out that, to reduce the deposition thus occurring on the lower surface of the peripheral edge portion of the substrate to be processed, it is effective to make the ions in the plasma reach the area under the peripheral edge portion of the substrate to be processed and make the ions collide with the lower surface of the peripheral edge portion of the substrate to be processed.

The present invention was made based on the above findings. Specifically, according to the present invention, there is provided a plasma processing apparatus which processes a substrate to be processed placed on a mounting table disposed in a process chamber, by generating plasma in the process chamber by application of high-frequency voltage, the apparatus including a focus ring disposed to surround a periphery of the substrate to be processed placed on the mounting table, wherein the focus ring includes: an outer ring portion disposed on an outer side of the periphery of the substrate to be processed placed on the mounting table and made of a conductive material; and an inner ring portion disposed under and at a predetermined interval apart from a peripheral edge portion of the substrate to be processed placed on the mounting table and made of a conductive material, and wherein the inner ring portion and the mounting table are electrically insulated from each other.

In this plasma processing apparatus, for example, the outer ring portion and the inner ring portion may be in electrical continuity to each other and the outer ring portion and the mounting table are insulated from each other. In this case, an insulating member may be disposed between the outer and inner ring portions and the mounting table. Further, the outer ring portion and the inner ring portion may be integrally formed. An interval between an outer circumferential surface of the substrate to be processed placed on the mounting table and an inner circumferential surface of the focus ring which faces the outer circumferential surface of the substrate to be processed may be wider than an interval between an upper surface of the inner ring portion and a lower surface of the peripheral edge portion of the substrate to be processed placed on the mounting table.

In this plasma processing apparatus, the outer ring portion and the inner ring portion may be electrically insulated from ground. In this case, capacitance between the outer and inner ring portions and the ground may be variable. Further, a variable direct-current power source may be electrically connected to the outer ring portion and the inner ring portion.

In this plasma processing apparatus, for example, the outer ring portion and the inner ring portion are electrically insulated from each other. In this case, the outer ring portion may be in electrical continuity to the mounting table.

An upper surface of the outer ring portion may have: an inclined surface portion disposed around the periphery of the substrate to be processed placed on the mounting table and gradually becoming higher toward an outer side and a horizontal surface portion formed continuously from and on an outer side of the inclined surface portion. Further, the conductive materials forming the outer ring portion and the inner ring portion may be, for example, one of silicon (Si), carbon (C), and silicon carbide (SiC).

According to another aspect of the present invention, there is provided a focus ring which is included in a plasma processing apparatus processing a substrate to be processed by generating plasma in a process chamber by application of high-frequency voltage, and which is disposed to surround a periphery of the substrate to be processed placed on a mounting table disposed in the process chamber, the focus ring including: an outer ring portion disposed on an outer side of the periphery of the substrate to be processed placed on the mounting table and made of a conductive material; and an inner ring portion disposed under and at a predetermined interval apart from a peripheral edge portion of the substrate to be processed placed on the mounting table and made of a conductive material, wherein the inner ring portion and the mounting table are electrically insulated from each other.

In this focus ring, for example, the outer ring portion and the inner ring portion may be in electrical continuity to each other, and the focus ring may further include an insulating member insulating the outer and inner ring portions and the mounting table from each other. In this case, the outer ring portion and the inner ring portion may be integrally formed. Further, a recessed portion may be formed in an inner circumferential surface facing an outer circumferential surface of the substrate to be processed placed on the mounting table.

In this focus ring, the outer ring portion and the inner ring portion may be connected to a capacitance varying means for varying capacitance between the outer and inner ring portions and ground. Further, the outer ring portion and the inner ring portion may be electrically connected to a variable direct-current power source.

The focus ring may further include, for example, an insulating member electrically insulating the outer ring portion and the inner ring portion from each other. In this case, the outer ring portion may be disposed so as to be in electrical continuity to the mounting table.

Further, in this focus ring, an upper surface of the outer ring portion may have: an inclined surface portion disposed around the periphery of the substrate to be processed placed on the mounting table and gradually becoming higher toward an outer side; and a horizontal surface portion formed continuously from and on an outer side of the inclined surface portion. The conductive materials forming the outer ring portion and the inner ring portion may be, for example, one of silicon (Si), carbon (C), and silicon carbide (SiC).

According to still another aspect of the present invention, there is provided a focus ring component including: any of the above focus rings; and a support member setting the focus ring in a state of surrounding the periphery of the substrate to be processed placed on the mounting table in the process chamber.

According to yet another aspect of the present invention, there is provided a plasma processing method of processing a substrate to be processed placed on a mounting table disposed in a process chamber by generating plasma in the process chamber by application of high-frequency voltage, wherein an electric field causing ions generated by the plasma to accelerate toward a lower surface of a peripheral edge portion of the substrate to be processed placed on the mounting table is formed under the peripheral edge portion of the substrate to be processed, thereby making the ions collide with the lower surface of the peripheral edge portion of the substrate to be processed.

In this plasma processing method, for example, to form the electric field, an inner ring portion made of a conductive material is disposed under and at a predetermined interval apart from the peripheral edge portion of the substrate to be processed placed on the mounting table and a potential difference is generated between the substrate to be processed and the inner ring portion. An amount of the ions colliding with the lower surface of the peripheral edge portion of the substrate to be processed may be adjusted by a change in intensity of the electric field. Further, equipotential surfaces in the electric field may be sparse on an outer side of an outer circumferential surface of the substrate to be processed placed on the mounting table and dense under the peripheral edge portion of the substrate to be processed placed on the mounting table.

According to the present invention, ions in plasma are made to reach the area under the peripheral edge portion of the substrate to be processed and made to collide with the lower surface of the peripheral edge portion of the substrate to be processed, and consequently, it is possible to reduce the occurrence of deposition on the lower surface of the peripheral edge portion of the substrate to be processed than was conventionally possible.

DETAILED DESCRIPTION OF THE INVENTION

Figure 1:
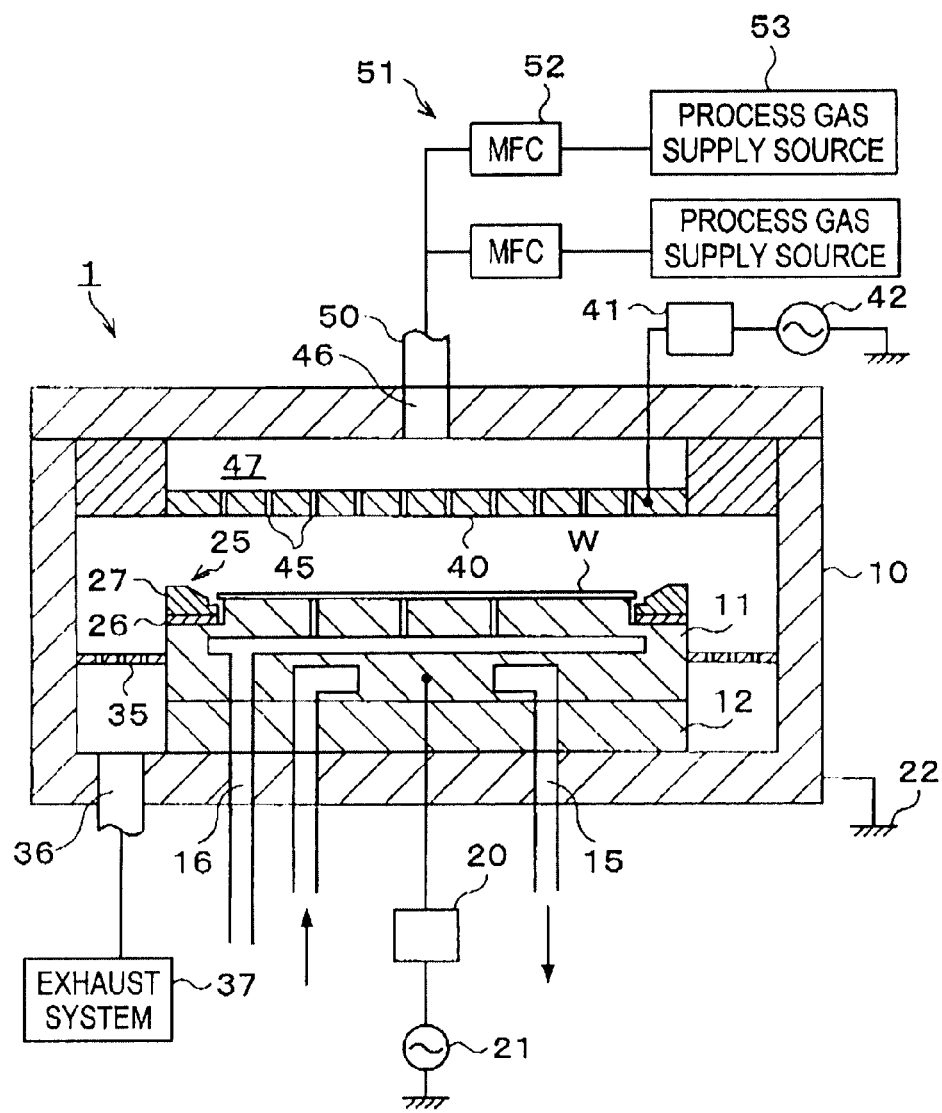
FIG. 1 is an explanatory view showing the schematic structure of a plasma processing apparatus according to an embodiment of the present invention.
Figure 2:
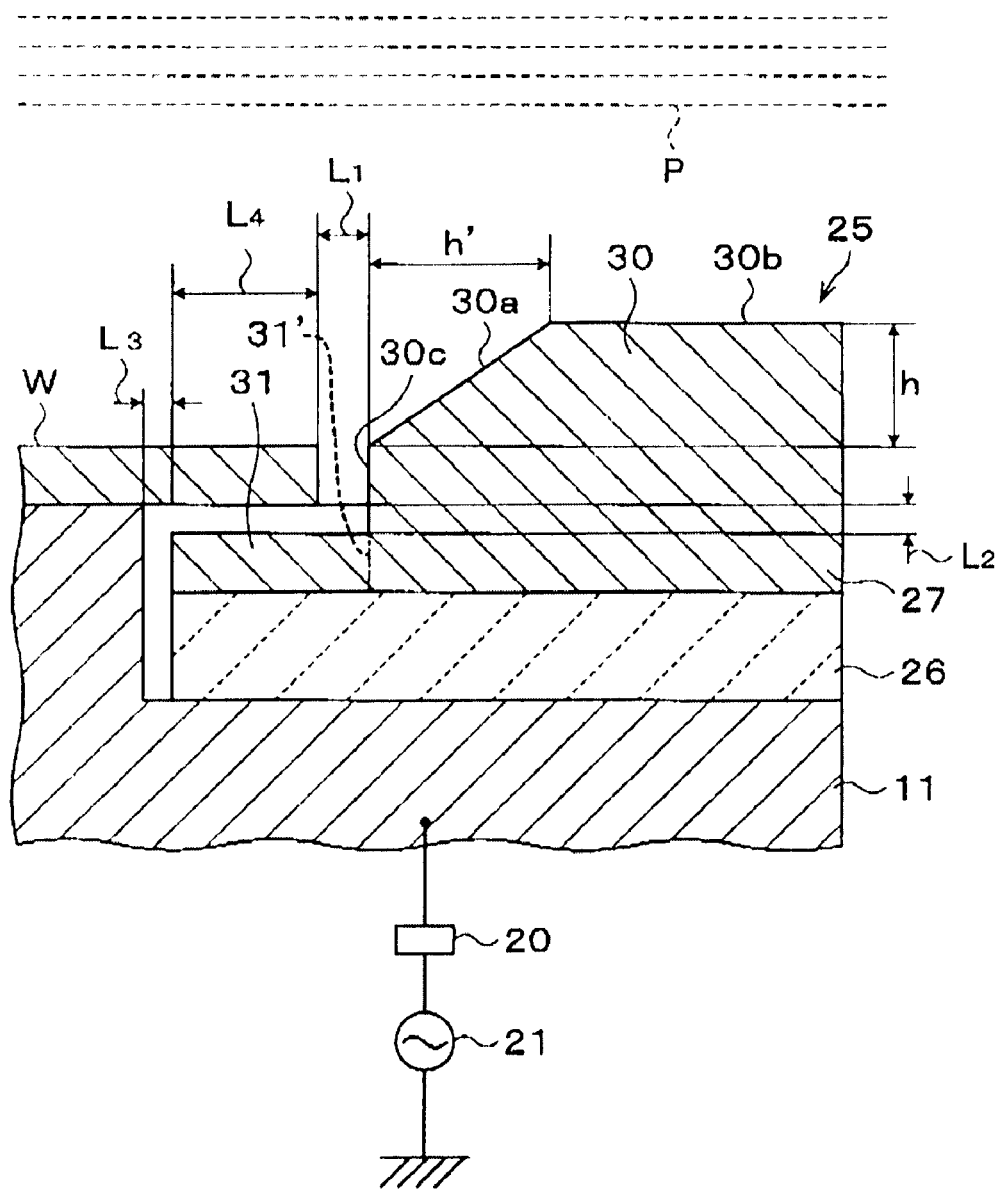
FIG. 2 is an enlarged vertical cross-sectional view showing a focus ring.

Hereinafter, a preferred embodiment of the present invention will be described with reference to the drawings. FIG. 1 is an explanatory view showing the schematic structure of a plasma processing apparatus 1 according to an embodiment of the present invention. FIG. 2 is an enlarged vertical cross-sectional view of a focus ring 25 included in the plasma processing apparatus 1. In the present specification and drawings, constituent elements having substantially the same functions and structures are denoted by the same reference numerals and symbols, and repeated description thereof will be omitted.

In an airtight process chamber 10 in a cylindrical shape, a mounting table 11 for placing a semiconductor wafer W as a substrate to be processed thereon and also serving as a lower electrode is disposed. The process chamber 10 and the mounting table 11 are made of a conductive material such as, for example, aluminum. However, the process chamber 10 and the mounting table 11 are electrically insulated from each other since the mounting table 11 is supported on a bottom surface of the process chamber 10 via an insulating plate 12 made of ceramic or the like.

The mounting table 11 includes a not-shown electrostatic chuck for suction-holding the semiconductor wafer W placed on an upper surface thereof. Further, in the mounting table 11, provided are a heat medium channel 15 through which an insulative fluid as a heat medium for temperature control circulates and a gas channel 16 through which gas for temperature control such as helium gas is supplied to a rear surface of the semiconductor wafer W. Thus circulating the insulative fluid controlled to a predetermined temperature in the heat medium channel makes it possible to control the mounting table 11 to the predetermined temperature. Further, the gas for temperature control is supplied via the gas channel 16 to a gap between the mounting table 11 and the rear surface of the semiconductor wafer W to promote heat exchange therebetween, so that the semiconductor wafer W can be controlled to a predetermined temperature accurately and efficiently.

A high-frequency power source 21 (RF power source) for bias is connected to the mounting table 11 via a matching device 20. A high-frequency voltage with a predetermined frequency is applied to the mounting table 11 from the high-frequency power source 21. The process chamber 10 is in electrical continuity to ground (earth) 22.

In the process chamber 10, the focus ring 25 is disposed around an upper surface of the mounting table 11 so as to surround a periphery of the semiconductor wafer W placed on the mounting table 11. The focus ring 25 includes a ring-shaped insulating member 26 placed directly on the mounting table 11 and a ring-shaped conductive member 27 disposed on top of the insulating member 26. The insulating member 26 is made of an insulative material (dielectric), for example, ceramics such as quartz or alumina, or resin such as Vespel (registered trademark). The conductive member 27 is made of a conductive material such as, for example, Si (Si doped with B or the like for producing conductivity), C, or SiC.

As shown in FIG. 2, the conductive member 27 includes: an outer ring portion 30 disposed on an outer side of the periphery of the semiconductor wafer W placed on the mounting table 11; and a ring-shaped inner ring portion 31 disposed under and at a predetermined interval apart from a peripheral edge portion of the semiconductor wafer W placed on the mounting table 11. In the shown example, since the outer ring portion 30 and the ring-shaped inner ring portion 31 are integrally formed as the conductive member 27 made of the conductive material, the outer ring portion 30 and the inner ring portion 31 are in electrical continuity to each other. However, since the insulating member 26 is interposed between the ring-shaped conductive member 27 and the mounting table 11 as described above, the outer ring portion 30 and the inner ring portion 31 are electrically insulated from the mounting table 11. A dotted line 31' in FIG. 2 is a boundary of the outer ring portion 30 and the inner ring portion 31. As shown by the boundary 31', in the integrally formed conductive member 27, a portion disposed on the outer side of the periphery of the semiconductor wafer W placed on the mounting table 11 is the outer ring portion 30, and a portion disposed under and at the predetermined interval apart from the peripheral edge portion of the semiconductor wafer W is the inner ring portion 31.

The ring-shaped conductive member 27 thus insulated from the mounting table 11 is in electrical contact with no other portion in the process chamber 10 except the insulating member 26. Therefore, the outer ring portion 30 and the inner ring portion 31 are electrically floated also from the ground 22.

An upper surface of the outer ring portion 30 has: an inclined surface portion 30a disposed around the periphery of the semiconductor wafer W placed on the mounting table 11 and gradually becoming higher toward the outer side; and a horizontal surface portion 30b formed continuously from and on the outer side of the inclined surface portion 30a. The horizontal surface portion 30b is set higher than an upper surface of the semiconductor wafer W placed on the mounting table 11, and the inclined surface portion 30a is set so as to become gradually higher toward the outer side up to the height of the horizontal surface portion 30b, with its inner edge positioned at substantially the same height as the upper surface of the semiconductor wafer W mounted on the mounting table 11.

Further, in the process chamber 10, a ring-shaped exhaust ring 35 having a large number of exhaust holes is provided on the outer side of the focus ring 25. A processing space in the process chamber 10 is vacuum-exhausted via the exhaust ring 35 by a vacuum pump or the like of an exhaust system 37 connected to an exhaust port 36.

In a ceiling portion above the mounting table 11 in the process chamber 10, a showerhead 40 is provided to face the mounting table 11 in parallel, and the mounting table 11 and the showerhead 40 function as a pair of electrodes (the lower electrode and an upper electrode). A high-frequency power source 42 for plasma generation is connected to the showerhead 40 via a matching device 41.

The showerhead 40 has a large number of gas jetting holes 42 in a lower surface thereof. The showerhead 40 has, in its inner portion, a gas diffusion space 47, and in an upper portion thereof, a gas introduction portion 46 is provided. A gas supply pipe 50 is connected to the gas introduction portion 46, and a gas supply system 51 is connected to the other end of the gas supply pipe 50. The gas supply system 51 includes mass-flow controllers (MFC) 52 for controlling gas flow rates, process gas supply sources 53 for supplying process gases for, for example, etching, and so on.

Next, the procedure of plasma processing by the plasma processing apparatus 1 as structured above will be described.

First, a not-shown gate valve provided in the process chamber 10 is opened, and the semiconductor wafer W is carried by a carrier mechanism (not shown) into the process chamber 10 via a load lock chamber (not shown) disposed adjacent to the gate valve and is placed on the mounting table 11. Then, after the carrier mechanism is made to retreat out of the process chamber 10, and the gate valve is closed to bring the inside of the process chamber 10 into an airtight state.

Thereafter, the inside of the process chamber 10 is exhausted to a predetermined vacuum degree via the exhaust port 36 by the vacuum pump of the exhaust system 37, and at the same time, predetermined process gases are supplied into the process chamber 10 from the process gas supply sources 53 through the showerhead 40.

Then, in this state, the high-frequency power for bias with a relatively low frequency is supplied from the high-frequency power source 21, and the high-frequency power for plasma generation with a relatively high frequency is supplied from the high-frequency power source 42, whereby plasma P is generated in an area above the semiconductor wafer W in the process chamber 10, as shown in FIG. 2. Radical molecules and ions in the plasma P thus generated in the area above the semiconductor wafer W are attracted toward the upper surface of the semiconductor wafer W, and by their actions, the upper surface of the semiconductor wafer W is plasma-processed.

Then, after the predetermined plasma processing is finished, the supply of the high-frequency powers from the high-frequency power sources 21, 42 is stopped to stop the plasma processing, and the semiconductor wafer W is carried out of the process chamber 10 in the reverse procedure to the above-described procedure.

Figure 3:
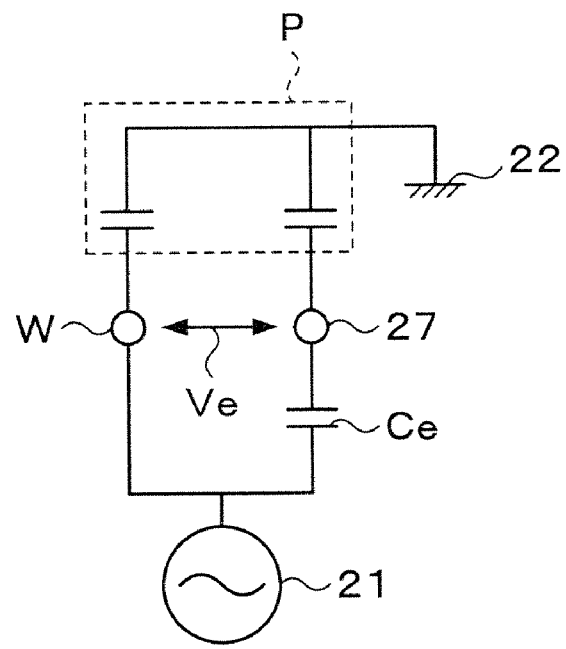
FIG. 3 is an explanatory diagram of a potential difference generated between a semiconductor wafer (mounting table) and a conductive member.

During the plasma processing described above, the plasma processing apparatus 1 of this embodiment generates a potential difference Ve between the semiconductor wafer W (mounting table 11) and the conductive member 27, as shown in FIG. 3, by adopting the focus ring 25 whose conductive member 27 is disposed on the mounting table 11 via the insulating member 26 as described above. In this case, the potential difference Ve is in inverse proportion to capacitance Ce between the semiconductor wafer W and the conductive member 27.

Figure 4:
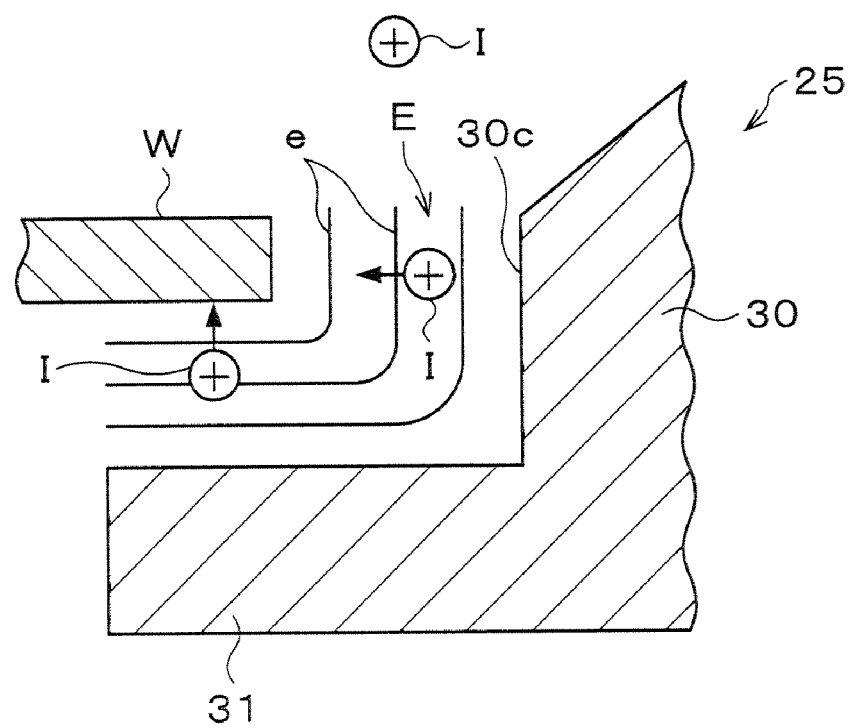
FIG. 4 is an explanatory view of an electric field formed by the potential difference between the semiconductor wafer and the conductive member.

Further, during the plasma processing, an electric field E shown in FIG. 4 is formed between the semiconductor wafer W and the conductive member 27 because the potential difference Ve is thus generated between the semiconductor wafer W and the conductive member 27. Equipotential surfaces e of the electric field E are substantially vertical between an outer circumferential surface of the semiconductor wafer W and an inner circumferential surface 30c of the outer ring portion 30 and are substantially horizontal between a lower surface of the peripheral edge portion of the semiconductor wafer W and an upper surface of the inner ring portion 31, as shown in FIG. 4. Owing to the action of the electric field E having such equipotential surfaces e, between the outer circumferential surface of the semiconductor wafer W and the inner circumferential surface 30c of the outer ring portion 30, ions I in the plasma P attracted downward toward a front surface of the semiconductor wafer W can accelerate in a direction toward the outer circumferential surface of the semiconductor wafer W, and between the lower surface of the peripheral edge portion of the semiconductor wafer W and the upper surface of the inner ring portion 31, the ions I in the plasma P can accelerate in a direction toward the lower surface of the peripheral edge portion of the semiconductor wafer W.

In this manner, during the plasma processing, by the action of the electric field E formed due to the potential difference Ve between the semiconductor wafer W and the conductive member 27, the ions I in the plasma P are made to collide with the outer circumferential surface of the semiconductor wafer W and the lower surface of the peripheral edge portion of the semiconductor wafer W, so that the occurrence of deposition both on the outer circumferential surface and the lower surface of the peripheral edge portion of the semiconductor wafer W can be reduced.

To reduce the occurrence of the deposition on the lower surface of the peripheral edge portion of the semiconductor wafer W, it is necessary to let at least part of the ions I in the plasma P pass between the outer circumferential surface of the semiconductor wafer W and the inner circumferential surface 30c of the outer ring portion 30 straight downward up to an area under the peripheral edge portion of the semiconductor wafer W, instead of making all of the ions I in the plasma P collide with the outer circumferential surface of the semiconductor wafer W between the outer circumferential surface of the semiconductor wafer W and the inner circumferential surface 30c of the outer ring portion 30. For this purpose, as shown in FIG. 2, an interval $L_1$ between the outer circumferential surface of the semiconductor wafer W placed on the mounting table 11 and the opposed inner circumferential surface 30c of the outer ring portion 30 is formed wider than an interval $L_2$ between the upper surface of the inner ring portion 31 and the lower surface of the peripheral edge portion of the semiconductor wafer W.

With this structure, it is possible to make the equipotential surfaces e shown in FIG. 4 relatively sparse between the outer circumferential surface of the semiconductor wafer W and the inner circumferential surface 30c of the outer ring portion 30, and relatively dense between the lower surface of the peripheral edge portion of the semiconductor wafer W and the upper surface of the inner ring portion 31. Consequently, between the outer circumferential surface of the semiconductor wafer W and the inner circumferential surface 30c of the outer ring portion 30, an accelerating force in the direction toward the outer circumferential surface of the semiconductor wafer W becomes relatively small, which allows the ions I to reach the area under the peripheral edge portion of the semiconductor wafer W. On the other hand, between the lower surface of the peripheral edge portion of the semiconductor wafer W and the upper surface of the inner ring portion 31, an accelerating force in the direction toward the lower surface of the peripheral edge portion of the semiconductor wafer W becomes relatively large, which allows the ions I to collide with the lower surface of the peripheral edge portion of the semiconductor wafer W, and therefore, it is possible to surely reduce the occurrence of the deposition on the lower surface of the peripheral edge portion of the semiconductor wafer W.

Preferable ranges of the interval $L_1$ between the outer circumferential surface of the semiconductor wafer W and the inner circumferential surface 30c of the outer ring portion 30 and the interval $L_2$ between the upper surface of the inner ring portion 31 and the lower surface of the peripheral edge portion of the semiconductor wafer W cannot be uniquely decided since they vary depending on the magnitude of the potential difference Ve generated between the semiconductor wafer W and the conductive member 27, the diameter and thickness of the semiconductor wafer W, the height of the inner circumferential surface 30c, and so on, but, for example, the interval $L_1$ between the outer circumferential surface of the semiconductor wafer W and the inner circumferential surface 30c of the outer ring portion 30 is 1 mm to 5 m, and desirably, 2 mm to 2.5 mm. If this interval $L_1$ is too small, abnormal discharge sometimes occurs between the outer circumferential surface of the semiconductor wafer W and the outer ring portion 30, and if, on the other hand, this interval $L_1$ is too large, there is a possibility that later-described plasma sheath on the semiconductor wafer W and plasma sheath on the outer ring portion 30 become discontinuous.

Further, for example, the interval $L_2$ between the upper surface of the inner ring portion 31 and the lower surface of the peripheral edge portion of the semiconductor wafer W is 0.2 mm to 1 mm, and desirably, 0.2 mm to 0.5 mm. If this interval $L_2$ is too small, abnormal discharge sometimes occurs between the upper surface of the inner ring portion 31 and the peripheral edge portion of the semiconductor wafer W, and if, on the other hand, this interval $L_2$ is too large, the equipotential surfaces e cannot be made dense between the lower surface of the peripheral edge portion of the semiconductor wafer W and the upper surface of the inner ring portion 31, and a sufficient force to cause the ions I to accelerate in the direction toward the lower surface of the peripheral edge portion of the semiconductor wafer W cannot be obtained, so that the occurrence of the deposition on the lower surface of the peripheral edge portion of the semiconductor wafer W cannot be sufficiently reduced. Further, a length $L_4$ is preferably 0.05 mm to 0.5 mm, $L_4$ being a length of a portion where the inner ring portion 31 and the peripheral edge portion of the semiconductor wafer W which face each other at the interval $L_2$ apart from each other overlap each other.

Further, in the shown embodiment, during the plasma processing, the plasma sheath formed on the semiconductor wafer W and the plasma sheath formed on the outer ring portion 30 of the conductive member 27 are different in thickness due to the generation of the potential difference Ve between the semiconductor wafer W and the conductive member 27. Nevertheless, a change in thickness of the plasma sheath on the boundary between the semiconductor wafer W and the outer ring portion 30 can be reduced since the focus ring 25 of this embodiment is structured such that the upper surface of the outer ring portion 30 is formed by the inclined surface portion 30a which gradually becomes higher toward the outer side and the horizontal surface portion 30b which is formed continuously from and on the outer side of the inclined surface portion 30a and is higher than the upper surface of the semiconductor wafer W. Consequently, a sharp change of the electric field E in the peripheral edge portion of the semiconductor wafer W is prevented and thus the ions I in the plasma P can be attracted substantially perpendicularly to the upper surface of the semiconductor wafer W also in the peripheral edge portion of the semiconductor wafer W, which can enhance uniformity of the plasma processing. Moreover, forming the upper surface of the outer ring portion 30 by the inclined surface portion 30a and the horizontal surface portion 30b can also lengthen the life of the focus ring 25 itself.

A height h of the inclined surface portion 30a formed in the upper surface of the outer ring portion 30 is preferably within a range from 0 mm to 6 mm, more preferably, from 2 mm to 4 m, from the upper surface of the semiconductor wafer W. Further, a horizontal length h' of the inclined surface portion 30a (length in the diameter direction of the semiconductor wafer W) is preferably within a range from 0.5 mm to 9 mm, more preferably, from 1 mm to 6 mm. Incidentally, the horizontal length h' of the inclined surface portion 30a can be 0 depending on the interval $L_1$ between the outer circumferential surface of the semiconductor wafer W and the inner circumferential surface 30c of the outer ring portion 30. In such a case, the outer ring portion 30 does not have the inclined surface portion 30a, but adjusting the interval $L_1$ makes it possible to reduce a sharp change in the electric field E in the peripheral edge portion of the semiconductor wafer W.

Further, during the plasma processing, if an inner edge of the inner ring portion 31 is too close to the mounting table 11, there is a possibility that abnormal discharge occurs between the mounting table 11 and the conductive member 27 due to the potential difference Ve therebetween. On the other hand, if the inner edge of the inner ring portion 31 is too apart from the mounting table 11, the inner ring portion 31 cannot sufficiently enter the area under the peripheral edge portion of the semiconductor wafer W and the above-described collision of the ions I in the plasma P with the lower surface of the peripheral edge portion of the semiconductor wafer W does not take place, so that the operation and effect of reducing the deposition cannot be obtained. Therefore, an interval $L_3$ between the inner edge of the inner ring portion 31 and the mounting table 11 shown in FIG. 2 is preferably within a range from 0.5 mm to 1 mm.

The magnitude of the capacitance Ce between the semiconductor wafer W and the conductive member 27 has to be decided based on individual plasma processing apparatuses actually in use. Generally, reducing the capacitance Ce results in an increase in the potential difference Ve generated between the semiconductor wafer W and the conductive member 27. Accordingly, between the lower surface of the peripheral edge portion of the semiconductor wafer W and the upper surface of the inner ring portion 31, a force causing the ions I in the plasma P to accelerate in the direction toward the lower surface of the peripheral edge portion of the semiconductor wafer W is strengthened, so that the effect of reducing the occurrence of the deposition on the lower surface of the peripheral edge portion of the semiconductor wafer W tends to increase. On the other hand, increasing the capacitance Ce results in a decrease in the potential difference Ve generated between the semiconductor wafer W and the conductive member 27. Accordingly, between the lower surface of the peripheral edge portion of the semiconductor wafer W and the upper surface of the inner ring portion 31, a force causing the ions I to accelerate in the plasma P in the direction toward the lower surface of the peripheral edge portion of the semiconductor wafer W is weakened, so that the effect of reducing the occurrence of the deposition on the lower surface of the peripheral edge portion of the semiconductor wafer W tends to reduce.

Further, as described above, an incident angle of the ions I on the peripheral edge portion of the semiconductor wafer W is influenced by the difference in thickness between the plasma sheaths formed on the semiconductor wafer W and on the outer ring portion 30 of the conductive member 27 during the plasma processing. Generally, decreasing the capacitance Ce results in an increase in the potential difference Ve generated between the semiconductor wafer W and the conductive member 27, so that the thickness of the plasma sheath formed on the outer ring portion 30 is reduced, and the incident angle of the ions I tends to tilt in a direction toward a center of the semiconductor wafer W (incident angle >90°). On the other hand, increasing the capacitance Ce results in a decrease in the potential difference Ve generated between the semiconductor wafer W and the conductive member 27, so that the thickness of the plasma sheath formed on the outer ring portion 30 increases, and the incident angle of the ions I tends to tilt in a direction toward an outer side of the center of the semiconductor wafer W (incident angle <90°).

Figure 5:
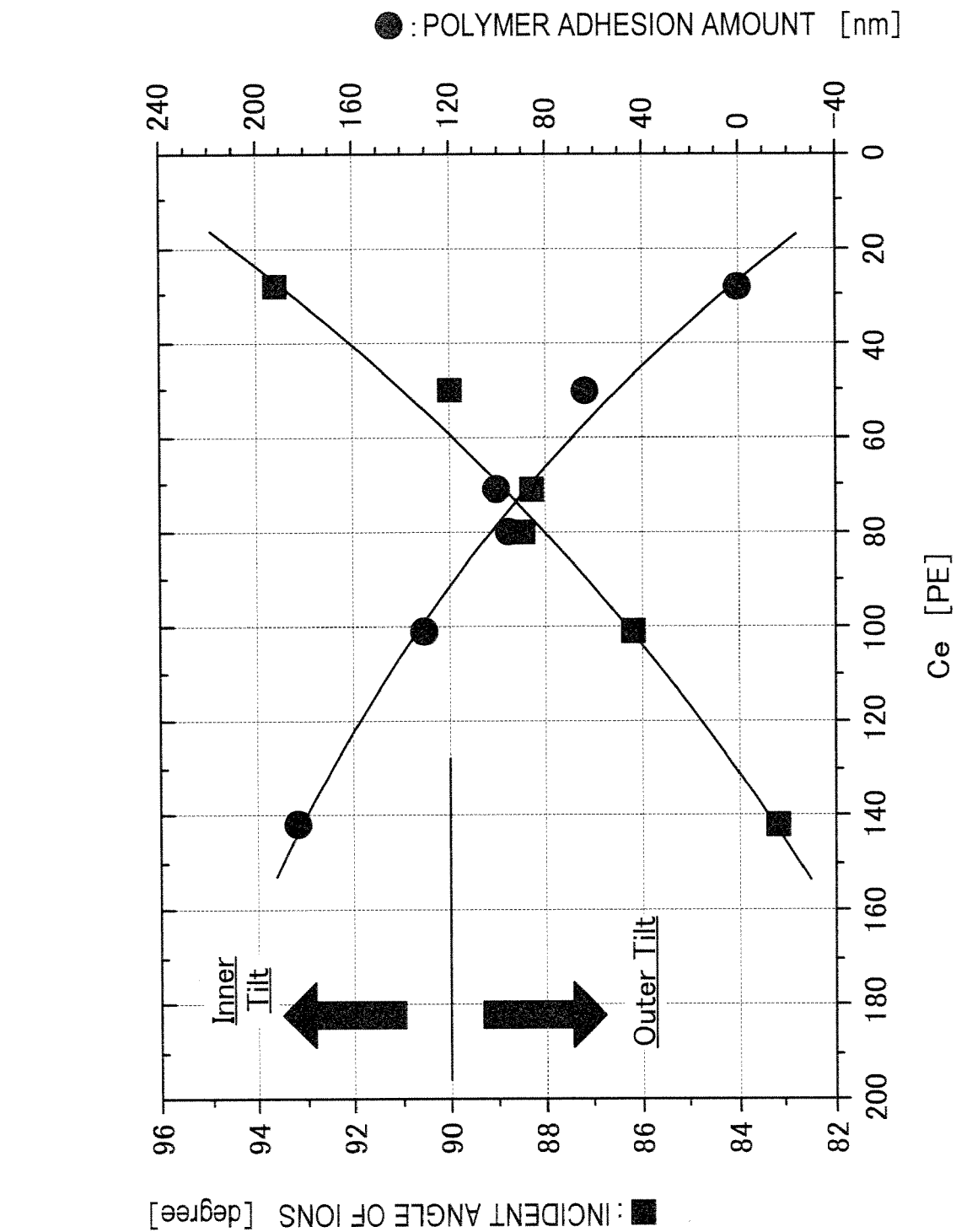
FIG. 5 is a graph showing results of simulation on how a polymer adhesion amount (right vertical axis) on a lower surface of a peripheral edge portion of the semiconductor wafer and an incident angle (left vertical axis) of ions on an upper surface of the peripheral edge portion of the semiconductor wafer are correlated with a change in capacitance between the semiconductor wafer and the conductive member.

Here, FIG. 5 shows results of simulation on how a polymer adhesion amount (right vertical axis) on the lower surface of the peripheral edge portion of the semiconductor wafer W and the incident angle (left vertical axis) of the ions I on the upper surface of the peripheral edge portion of the semiconductor wafer W are correlated with the change in the capacitance Ce between the semiconductor wafer W and the conductive member 27. The results of the simulation conducted by the present inventors have led to the confirmation of the above tendencies.

Therefore, according to the plasma processing apparatus 1 of this embodiment, it is possible to more reduce the occurrence of the deposition on the lower surface side of the peripheral edge portion of the semiconductor wafer W than was conventionally possible, and since the tilt of the electric field E in the peripheral edge portion of the semiconductor wafer W is prevented, substantially vertical etching is possible also in the peripheral edge portion of the semiconductor wafer W, so that in-plane uniformity of the processing can be enhanced.

Figure 6:
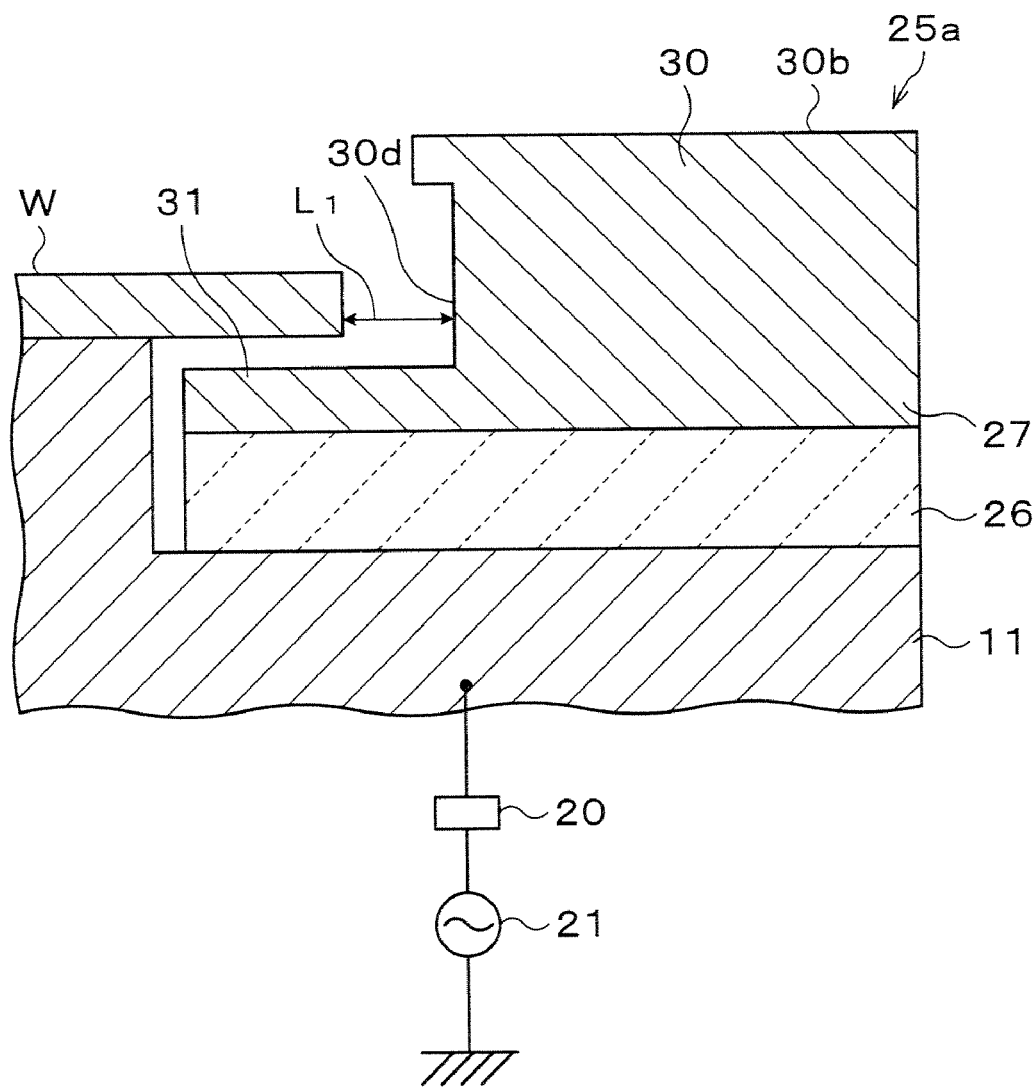
FIG. 6 is an enlarged vertical cross-sectional view showing a focus ring having a recessed portion formed in an inner circumferential surface of an outer ring portion facing an outer circumferential surface of the semiconductor wafer.

In the foregoing, an example of the preferred embodiment of the present invention is shown, but the present invention is not limited to the form shown here as an example. To widen the interval $L_1$ between the outer circumferential surface of the semiconductor wafer W placed on the mounting table 11 and the inner circumferential surface 30c of the outer ring portion 30, a recessed portion 30d, for instance, may be formed in the inner circumferential surface 30c of the outer ring portion 30 facing the outer circumferential surface of the semiconductor wafer W, as in a focus ring 25a shown in FIG. 6. By thus forming the recessed portion 30d to sufficiently widen the interval $L_1$ from the outer circumferential surface of the semiconductor wafer W, it is possible to allow the ions I to more smoothly pass up to the area under the peripheral edge portion of the semiconductor wafer W. Incidentally, in the case of the focus ring 25a described in FIG. 6, it is desirable that the upper surface of the outer ring portion 30 does not have the inclined surface portion 30a.

Figure 7:
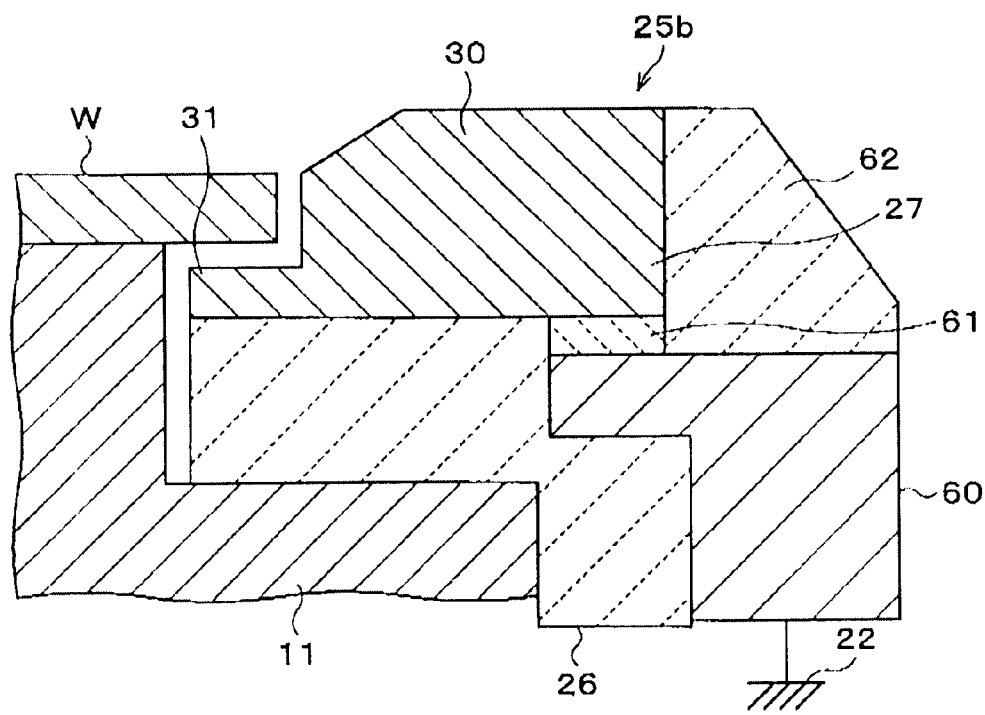
FIG. 7 is an enlarged vertical cross-sectional view showing a focus ring in which a second conductive member in electrical continuity to ground is disposed close to the conductive member via an insulating member (dielectric)

Another possible structure is such that a second conductive member 60 electrically connected to the ground 22 is disposed close to the conductive member 27 insulated from the mounting table 11 by the insulating member 26, and a second insulating member (dielectric) 61 is interposed between the conductive member 27 and the conductive member 60, as in a focus ring 25b shown in FIG. 7. Incidentally, in the example shown in FIG. 7, a cover ring 62 made of an insulative material is provided on an outer side of the conductive member 27.

Figure 8:
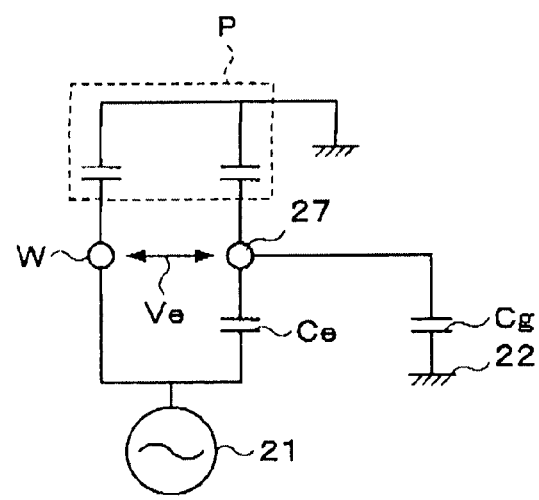
FIG. 8 is an explanatory view of a potential difference generated between the semiconductor wafer (mounting table) and the conductive member when the focus ring shown in FIG. 7 is used.

When this focus ring 25b is used, during the plasma processing, the potential difference Ve is generated between the semiconductor wafer W (mounting table 11) and the conductive member 27 and a potential difference Vg is also generated between the conductive member 27 and the ground 22 (conductive member 60), as shown in FIG. 8. In this case, the potential difference Ve between the semiconductor wafer W (mounting table 11) and the conductive member 27 is in inverse proportion to the capacitance Ce between the semiconductor wafer W and the conductive member 27, and the potential difference Vg between the conductive member 27 and the ground 22 is in inverse proportion to capacitance Cg which is capacitance between the conductive member 27 and the ground 22. The relation expressed by the following expressions (1) to (3) holds among the potential differences Ve, Vg, and the capacitances Ce, Cg.

$$Ve + Vg = V_{total} \qquad (1)$$

$$Ce \times Ve = Cg \times Vg \qquad (2)$$

$$Ve = Cg \times V_{total}/(Cg+Ce) \qquad (3)$$

It is understood from the expression (3) that varying the capacitance Cg between the conductive member 27 and the ground 22 can change the potential difference Ve between the semiconductor wafer W (mounting table 11) and the conductive member 27. For example, in the focus ring 25b shown in FIG. 7, the capacitance Cg between the conductive member 27 and the ground 22 is changed by a method such as changing the proximate distance between the conductive member 27 and the second conductive member 60, changing a dielectric constant of the second insulating member (dielectric) 61 interposed between the conductive member 27 and the conductive member 60, or the like, which makes it possible to change the potential difference Ve between the semiconductor wafer W (mounting table) 11 and the conductive member 27.

Figure 9:
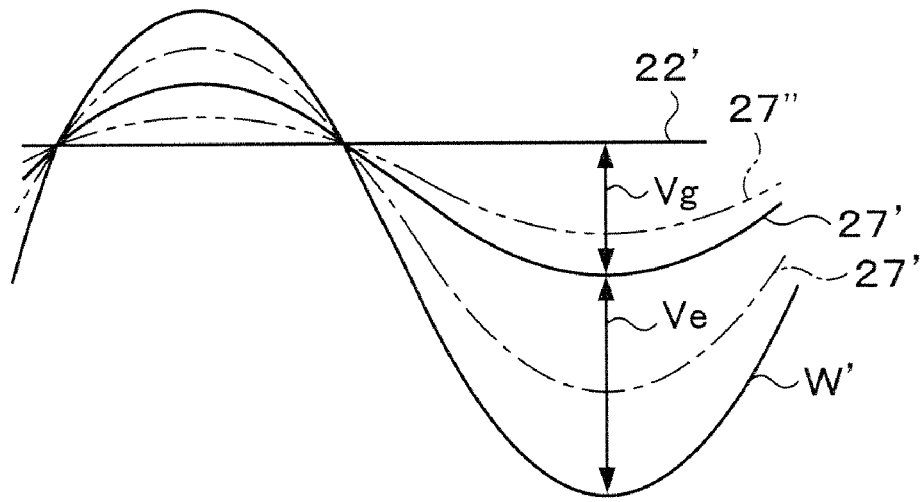
FIG. 9 is a graph showing how potentials of the semiconductor wafer, the conductive member, and the ground change during plasma processing when the focus ring shown in FIG. 7 is used.

This correlation will be described with reference to FIG. 9. In FIG. 9, a curve W' represents a change in potential of the semiconductor wafer W during the plasma processing, a curve 27' represents a change in potential of the conductive member 27 during the plasma processing, and a straight line 22' represents potential of the ground 22. In FIG. 9, a width between the curve W' and the curve 27' is the potential difference Ve between the semiconductor wafer W (mounting table 11) and the conductive member 27, and a width between the curve 27' and the straight line 22' is the potential difference Vg between the conductive member 27 and the ground 22. As shown in FIG. 9, if the potential difference Vg between the conductive member 27 and the ground 22 is increased (in a case of a chain line 27' in FIG. 9), the potential difference Ve between the semiconductor wafer W (mounting table 11) and the conductive member 27 decreases. On the other hand, if the potential difference Vg between the conductive member 27 and the ground 22 is decreased (in a case of a chain double-dashed line 27' in FIG. 9), the potential difference Ve between the semiconductor wafer W (mounting table 1) and the conductive member 27 increases. By thus changing the potential difference Vg between the conductive member 27 and the ground 22, it is possible to change the potential difference Ve between the semiconductor wafer W (mounting table 11) and the conductive member 27.

Figure 10:
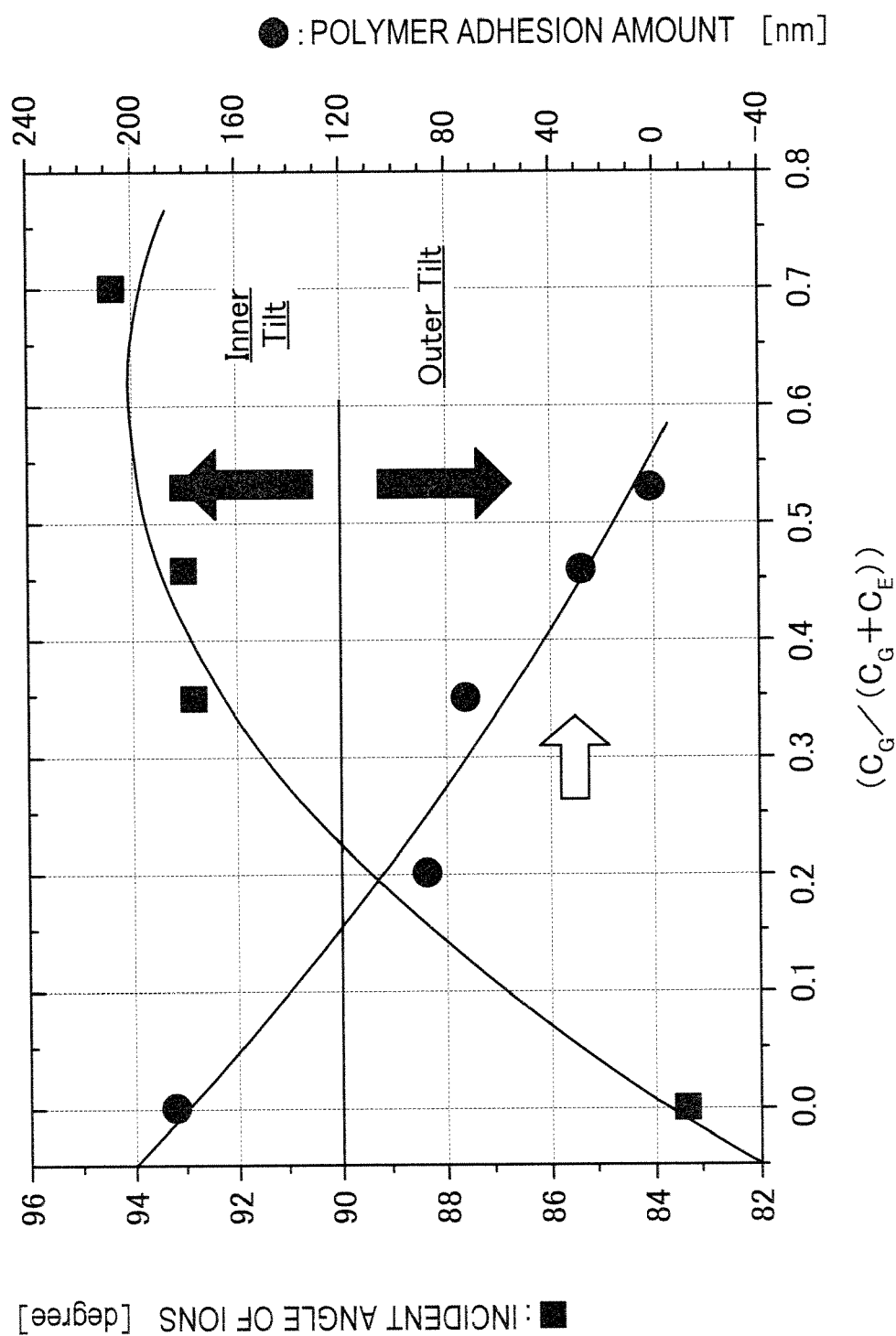
FIG. 10 is a graph showing results of simulation on how a polymer adhesion amount (right vertical axis) on the lower surface of the peripheral edge portion of the semiconductor wafer and an incident angle (left vertical axis) of ions on the upper surface of the peripheral edge portion of the semiconductor wafer are correlated with a change in potential difference (capacitance ratio (Cg/CG+Ce)) between the semiconductor wafer and the conductive member, when the focus ring in FIG. 7 is used.

Here, FIG. 10 shows results of simulation on how a polymer adhesion amount (right vertical axis) on the lower surface of the peripheral edge portion of the semiconductor wafer W and an incident angle (left vertical axis) of the ions I on the upper surface of the peripheral edge portion of the semiconductor wafer W are correlated with a change in the potential difference Ve between the semiconductor wafer W (mounting table 11) and the conductive member 27, in the plasma processing apparatus 1 including the focus ring 27b shown in FIG. 7. Note that the total ($V_{total}$) of the potential difference Ve between the semiconductor wafer W (mounting table 11) and the conductive member 27 and the potential difference Vg between the conductive member 27 and the ground 22 (conductive member 60) is fixed, and as is shown by the expression (3), the potential difference Ve between the semiconductor wafer W (mounting table 11) and the conductive member 27 is proportional to a capacitance ratio (Cg/(Cg+Ce)), and therefore, the capacitance ratio (Cg/(Cg+Ce)) is taken on the horizontal axis in FIG. 10.

The results of the simulation conducted by the present inventors show the tendency that the occurrence of the deposition on the lower surface of the peripheral edge portion of the semiconductor wafer W is reduced and the incident angle of the ions I tilts in the direction toward the center of the semiconductor wafer W (incident angle >90°) when the potential difference Ve generated between the semiconductor wafer W and the conductive member 27 is increased (when the capacitance ratio (Cg/(Cg+Ce) is increased). The results also shows the tendency that the occurrence of the deposition on the lower surface of the peripheral edge portion of the semiconductor wafer W increases and the incident angle of the ions I tilts in the direction toward the outer side from the center of the semiconductor wafer W (incident angle <90°) when the potential difference Ve generated between the semiconductor wafer W and the conductive member 27 is decreased (when the capacitance ratio (Cg/(Cg+Ce) is decreased).

Figure 11:
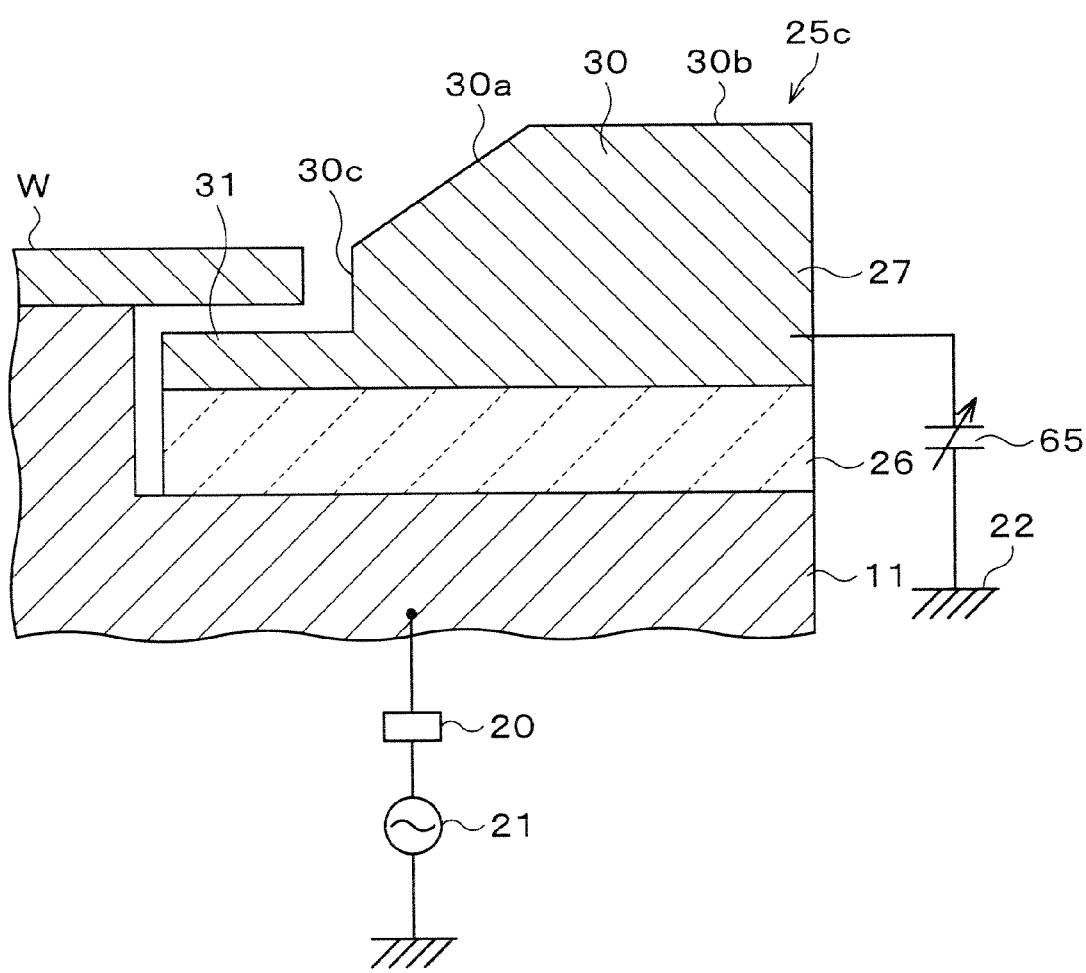
FIG. 11 is an enlarged vertical cross-sectional view of a focus ring having a conductive member electrically connected to the ground via a variable capacitor.

Further, to more easily change the potential difference Ve generated between the semiconductor wafer W and the conductive member 27, the conductive member 27 insulated from the mounting table 11 by the insulating member 26 may be electrically connected to the ground 22 via a variable capacitor 65, as in a focus ring 25c shown in FIG. 11.

When the focus ring 25 is used, as in the case where the focus ring 25b previously described with reference to FIG. 7 and FIG. 8 is used, the potential difference Ve is generated between the semiconductor wafer W (mounting table 11) and the conductive member 27 and the potential difference Vg is generated between the conductive member 27 and the ground 22 (conductive member 60) during the plasma processing. According to this focus ring 25c, by adjusting the variable capacitor 65, it is possible to change the capacitance Cg between the conductive member 27 and the ground 22, and accordingly, the potential difference Ve between the semiconductor wafer W (mounting table 11) and the conductive member 27 can be easily changed. By thus changing the potential difference Ve generated between the semiconductor wafer W and the conductive member 27, it is possible to easily adjust an amount of the ions I colliding with the lower surface of the peripheral edge portion of the semiconductor wafer W.

Figure 12:
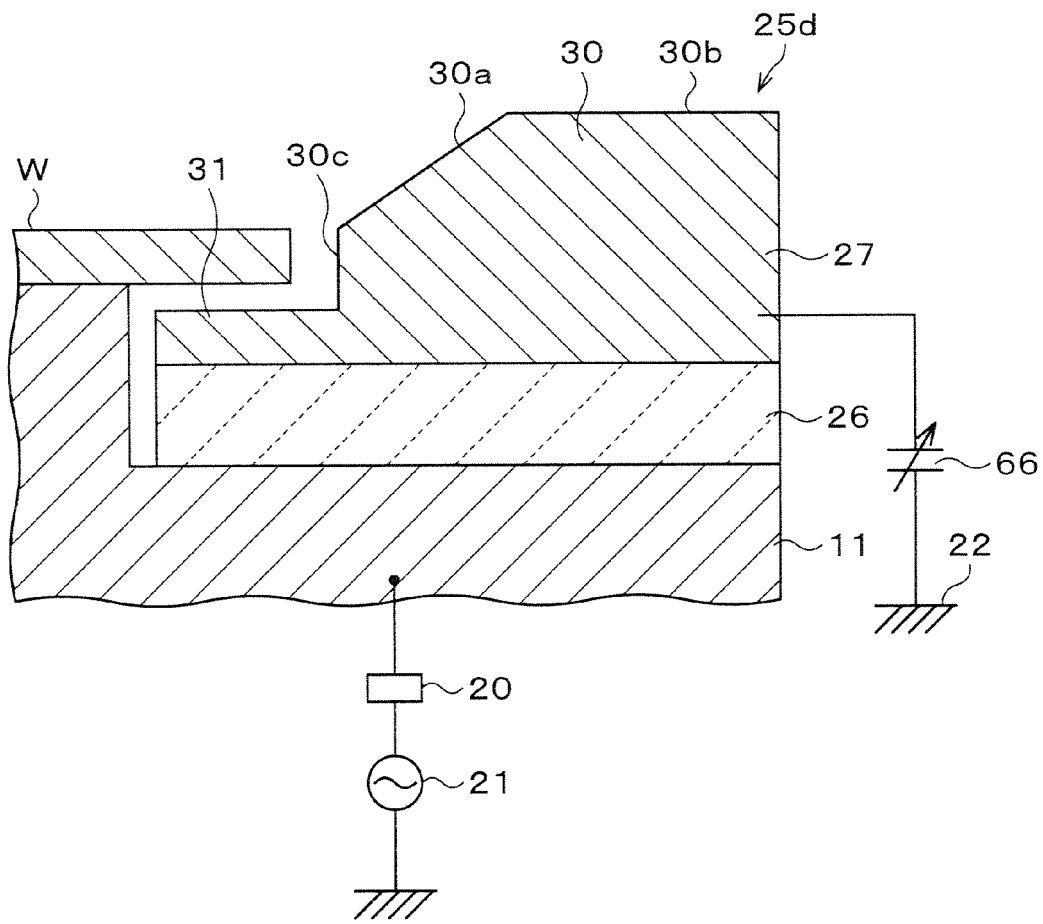
FIG. 12 is an enlarged vertical cross-sectional view of a focus ring having a conductive member electrically connected to a variable direct-current power source.

Further, to change the potential difference Ve generated between the semiconductor wafer W and the conductive member 27, a variable direct-current power source 66 may be electrically connected to the conductive member 27 insulated from the mounting table 1 by the insulating member 26, as in a focus ring 25d shown in FIG. 12.

Figure 13:
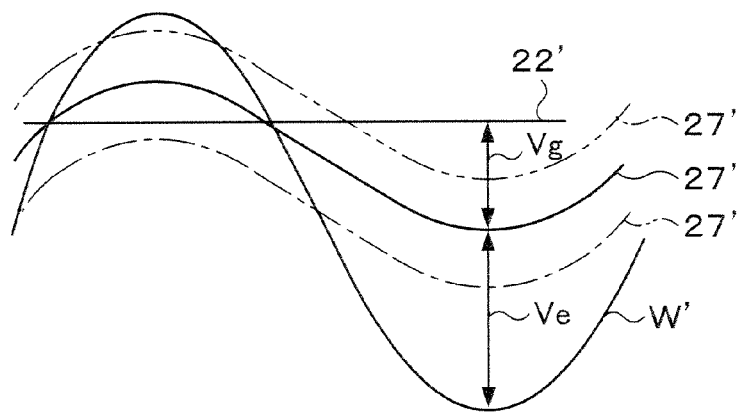
FIG. 13 is a graph showing how potentials of the semiconductor wafer, the conductive member, and the ground change during the plasma processing when the focus ring shown in FIG. 12 is used.

When this focus ring 25d is used, as in the case where the focus ring 25b previously described with reference to FIG. 7 and FIG. 8 is used, the potential difference Ve is generated between the semiconductor wafer W (mounting table 11) and the conductive member 27 and the potential difference Vg is generated between the conductive member 27 and the ground 22 (conductive member 60) during the plasma processing. According to this focus ring 25d, by adjusting the variable direct-current power source 66, it is possible to shift the potential difference Vg between the conductive member 27 and the ground 22 upward or downward as shown in FIG. 13. When the potential difference Vg is shifted downward in the drawing (in a case of a chain line 27' in FIG. 13), the potential difference Ve between the semiconductor wafer W (mounting table 11) and the conductive member 27 decreases. On the other hand, when the potential difference Vg is shifted upward in the drawing (in a case of a chain double-dashed line 27' in FIG. 13), the potential difference Ve between the semiconductor wafer W (mounting table 11) and the conductive member 27 increases. By thus adjusting the variable direct-current power source 66 connected to the conductive member 27, it is possible to easily change the potential difference Ve between the semiconductor wafer W (mounting table 11) and the conductive member 27.

Further, the above description shows a form where the focus rings 27, 27a, 27b, 27c, 27d are all structured such that the outer ring portion 30 disposed on the outer side of the periphery of the semiconductor wafer W placed on the mounting table 11 and the inner ring portion 31 disposed under the peripheral edge portion of the semiconductor wafer W are integrally formed as the conductive member 27, but the outer ring portion 30 and the inner ring portion 31 may be formed as different members. Further, the outer ring portion 30 and the inner ring portion 31 thus formed as different members may be in electrical continuity to each other or may be electrically insulated from each other.

Figure 14:
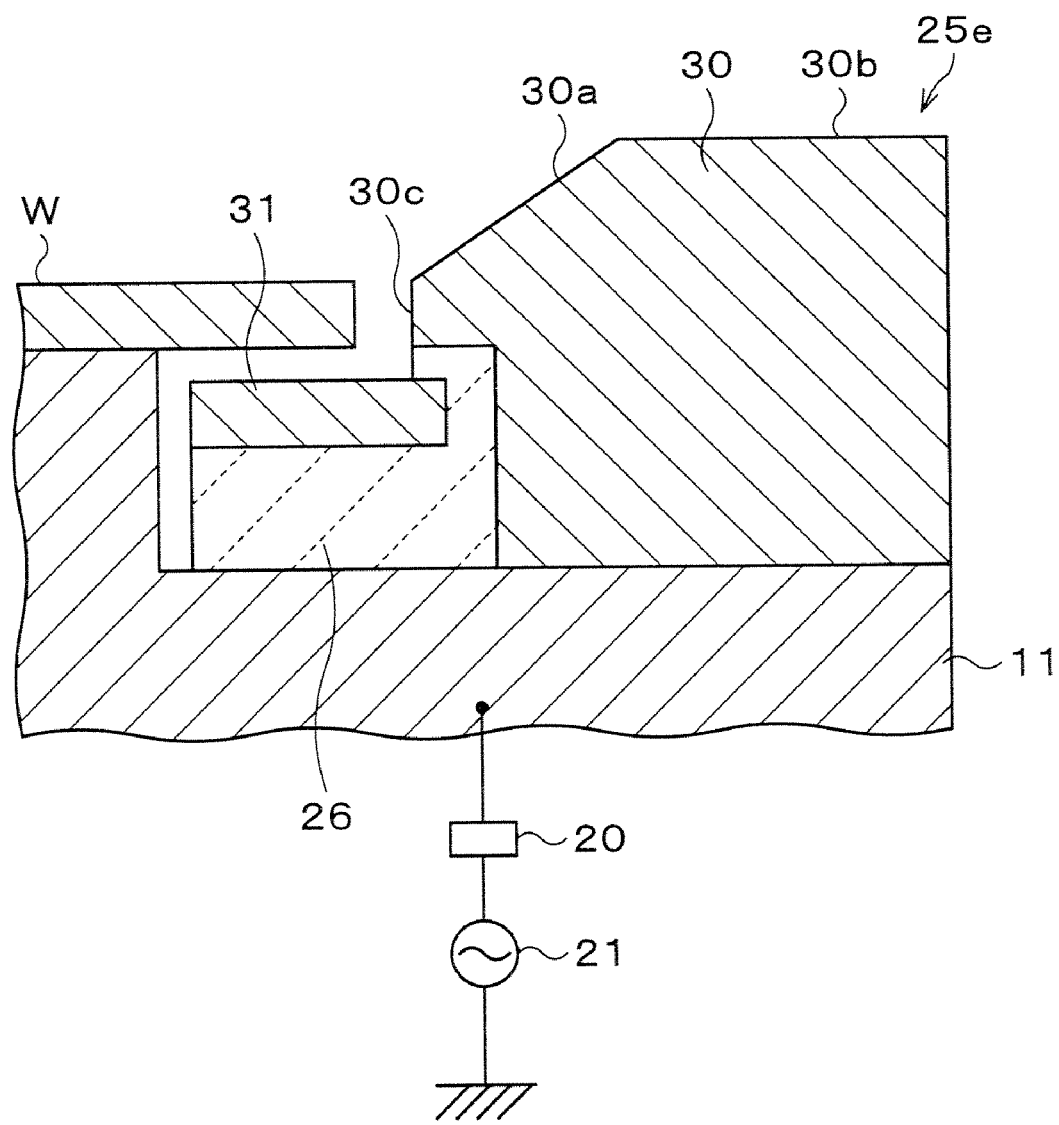
FIG. 14 is an enlarged vertical cross-sectional view of a focus ring in which an outer ring portion and an inner ring portion are electrically insulated from each other.

A focus ring 25e shown in FIG. 14 is structured such that the outer ring portion 30 disposed on the outer side of the periphery of the semiconductor wafer W placed on the mounting table 11 and the inner ring portion 31 disposed under the peripheral edge portion of the semiconductor wafer W are formed as different members, and these outer ring portion 30 and inner ring portion 31 are electrically insulated from each other. In this focus ring 25e, the outer ring portion 30 is placed on the mounting table 11, being in electrical continuity to the mounting table 11. On the other hand, the inner ring portion 31 is electrically insulated from the outer ring portion 30 and the mounting table 11 since the insulating member 26 is interposed between the inner ring portion 31 and these outer ring portion 30 and mounting table 11.

In the plasma processing apparatus 1 including the focus ring 25e shown in FIG. 14, during the plasma processing, the outer ring portion 30 is constantly equal in potential to the mounting table 11 and no potential difference is generated between the semiconductor wafer W and the outer ring portion 30, but since the insulating member 26 is interposed between the inner ring portion 31 and the mounting table 11, the inner ring portion 31 has high impedance to the high-frequency power applied to the mounting table 11, so that the potential difference Ve is generated only between the semiconductor wafer W and the inner ring portion 31. Consequently, an electric field causing the ions I in the plasma to accelerate in the direction toward the lower surface of the peripheral edge portion of the semiconductor wafer W is formed between the lower surface of the peripheral edge portion of the semiconductor wafer W and the upper surface of the inner ring portion 31, so that it is possible to reduce the occurrence of the deposition on the lower surface of the peripheral edge portion of the semiconductor wafer W. In addition, when the focus ring 25e shown in FIG. 14 is used, since no potential difference is generated between the outer circumferential surface of the semiconductor wafer W and the inner circumferential surface of the outer ring portion 30, the ions I in the plasma are allowed to smoothly pass between the outer circumferential surface of the semiconductor wafer W and the inner circumferential surface of the outer ring portion 30. The ions I thus allowed to reach the area under the peripheral edge portion of the semiconductor wafer W are made to collide with the lower surface of the peripheral edge portion of the semiconductor wafer W, which makes it possible to further reduce the occurrence of the deposition on the lower surface of the peripheral edge portion of the semiconductor wafer W.

Figure 15:
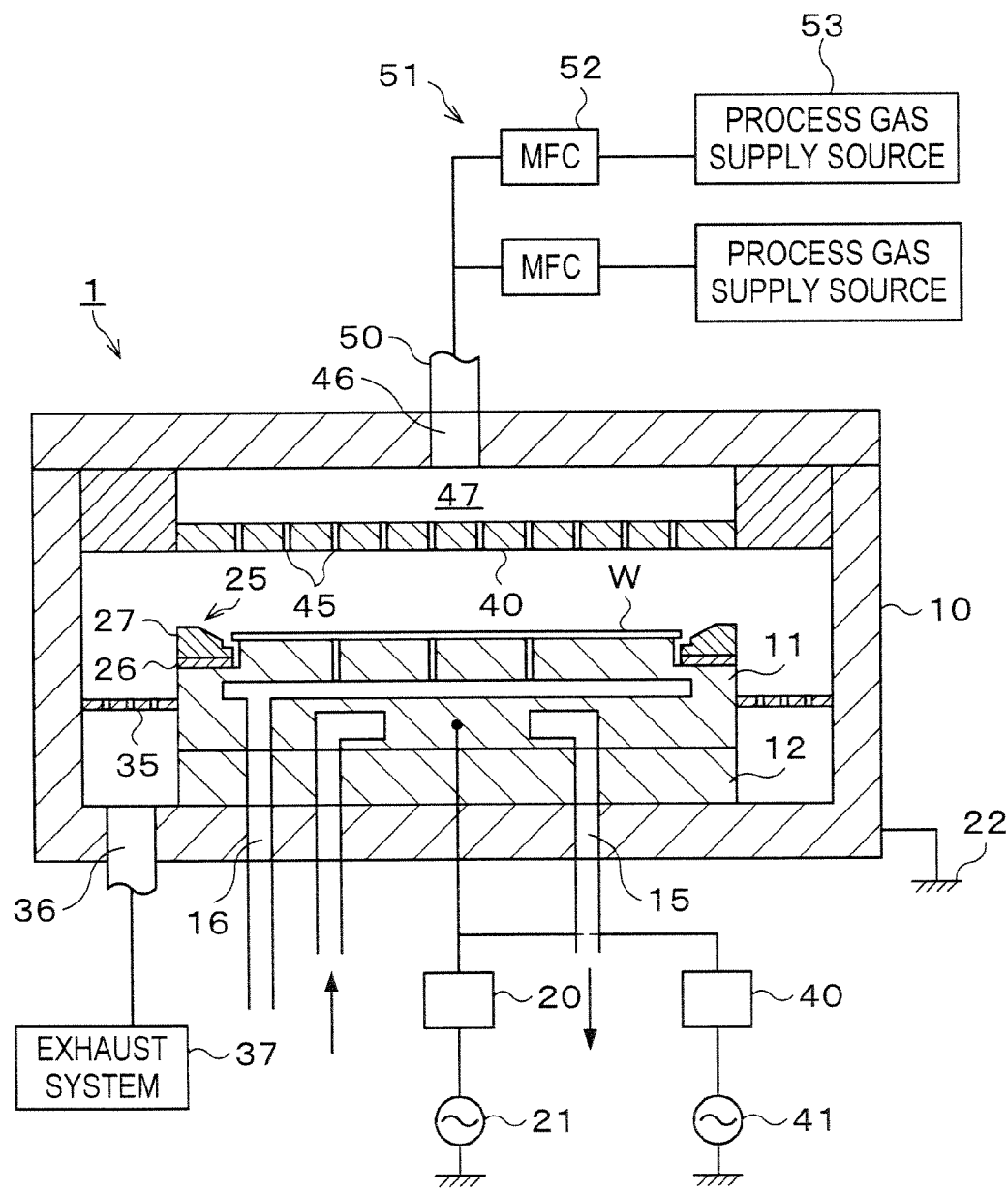
FIG. 15 is an explanatory view showing the schematic structure of a plasma processing apparatus in which a high-frequency power source for plasma generation and a high-frequency power source for bias are both connected to a mounting table.

Further, FIG. 1 shows the example where the high-frequency power for plasma generation with a relatively high frequency is supplied to the showerhead 40 (upper electrode) provided in the ceiling portion of the vacuum chamber 10, but as shown in FIG. 15, the high-frequency power source 42 supplying the high-frequency power for plasma generation with a relatively high frequency and the matching device 41 as well as the high-frequency power source 21 supplying the high-frequency power for bias with a relatively low frequency and the matching device 20 may be connected to the mounting table 11.

Further, the present invention is also applicable to a focus ring component including a support member suitable for setting the focus ring 25, 25a, 25b, 25c, 25d, or 25e described above in a state of surrounding the periphery of the semiconductor wafer W placed on the mounting table 11 in the process chamber 10. In this case, the mounting table 11, the exhaust ring 35, and the like are examples of the support member supporting the focus ring 25, 25a, 25b, 25c, 25d, or 25e. Further, the second conductive member 60 or the second insulating member 61 described with reference to FIG. 7 may be used as the support member.

What is claimed is:

1. A plasma processing apparatus which processes a substrate to be processed placed on a mounting table disposed in a process chamber, by generating plasma in the process chamber by application of high-frequency voltage, the apparatus comprising:
   a focus ring disposed to surround a periphery of the substrate to be processed placed on the mounting table,
   wherein said focus ring includes a ring-shaped first insulating member and a ring-shaped first conductive member disposed on top of the first insulating member, and the first conductive member includes: an outer ring portion disposed on an outer side of the periphery of the substrate to be processed placed on the mounting table; and an inner ring portion disposed under and at a predetermined interval apart from a peripheral edge portion of the substrate to be processed placed on the mounting table,
   wherein an interval L1 between an outer circumferential surface of the substrate to be processed placed on the mounting table and an inner circumferential surface of said focus ring which faces the outer circumferential surface of the substrate to be processed is wider than an interval L2 between an upper surface of the inner ring portion and a lower surface of the peripheral edge portion of the substrate to be processed placed on the mounting table,
   wherein the inner ring portion and the mounting table are electrically insulated from each other,
   wherein a second conductive member electrically connected to ground is disposed close to the outer ring portion insulated from the mounting table by the first insulating member, and a second insulating member is interposed between the outer ring portion and the second conductive member,
   wherein the first insulating member includes a first inner circumferential surface with the same diameter as an inner surface of the inner ring portion, a second inner circumferential surface which abuts the mounting table, a first outer circumferential surface which abuts an inner circumferential surface of the second insulating member and a first inner circumferential surface of the second conductive member, and a second outer circumferential surface which abuts a second inner circumferential surface of the second conductive member, and
   wherein a diameter of the second inner circumferential surface of the first insulating member is greater than the diameter of the first inner circumferential surface of the first insulating member and a diameter of the second outer circumferential surface of the first insulating member is greater than a diameter of the first outer circumferential surface of the first insulating member.

2. The plasma processing apparatus according to claim 1, wherein a capacitance between the substrate to be processed and the first conductive member is changed by changing a dielectric constant of the second insulating member.

3. The plasma processing apparatus according to claim 1, wherein the interval L1 is 2 to 2.5 mm and the interval L2 is 0.2 to 1 mm.

4. The plasma processing apparatus according to claim 1, wherein an upper surface of the outer ring portion includes an inclined surface portion disposed around the periphery of the substrate to be processed placed on the mounting table and gradually becoming higher toward an outer side; and a horizontal surface portion formed continuously from and on an outer side of the inclined surface portion.

5. The plasma processing apparatus according to claim 1, wherein a conductive material forming each of the outer ring portion and the inner ring portion is one of silicon (Si), carbon (C), and silicon carbide (SiC).

6. The plasma processing apparatus according to claim 1, wherein a first upper face of the first insulating member abuts the a lower face of the first conductive member, a second upper face of the first insulating member abuts a lower face of the second conductive member connecting the first and second inner circumferential surfaces of the second conductive member, and the first upper face of the first insulating member is higher than the second upper face of the first insulating member.

7. The plasma processing apparatus according to claim 6, wherein an upper face of the second insulating member abuts the lower face of the first conductive member and a lower face of second insulating member abuts an upper face of the second conductive member.

8. The plasma processing apparatus according to claim 7, further comprising a cover ring provided on an outer circumferential side of the first conductive member,
   wherein an inner circumferential surface of cover ring abuts an outer circumferential surface of the second insulating member and a lower surface of the cover ring abuts the upper face of the second conductive member.

9. A focus ring which is included in a plasma processing apparatus processing a substrate to be processed by generating plasma in a process chamber by application of high-frequency voltage, and which is disposed to surround a periphery of the substrate to be processed placed on a mounting table disposed in the process chamber, the focus ring comprising:

a ring-shaped first insulating member; and a ring-shaped first conductive member disposed on top of said first insulating member, wherein said first conductive member includes an outer ring portion disposed on an outer side of the periphery of the substrate to be processed placed on the mounting table; and an inner ring portion disposed under and at a predetermined interval apart from a peripheral edge portion of the substrate to be processed placed on the mounting table, wherein an interval L1 between an outer circumferential surface of the substrate to be processed placed on the mounting table and an inner circumferential surface of said focus ring which faces the outer circumferential surface of the substrate to be processed is wider than an interval L2 between an upper surface of the inner ring portion and a lower surface of the peripheral edge portion of the substrate to be processed placed on the mounting table, wherein said inner ring portion and the mounting table are electrically insulated from each other, wherein a second conductive member electrically connected to ground is disposed close to the outer ring portion insulated from the mounting table by a first insulating member, and a second insulating member is interposed between the outer ring portion and the second conductive member, wherein the first insulating member includes a first inner circumferential surface with the same diameter as an inner surface of the inner ring portion, a second inner circumferential surface which abuts the mounting table, a first outer circumferential surface which abuts an inner circumferential surface of the second insulating member and a first inner circumferential surface of the second conductive member, and a second outer circumferential surface which abuts a second inner circumferential surface of the second conductive member, and wherein a diameter of the second inner circumferential surface of the first insulating member is greater than the diameter of the first inner circumferential surface of the first insulating member and a diameter of the second outer circumferential surface of the first insulating member is greater than a diameter of the first outer circumferential surface of the first insulating member.

10. A focus ring component comprising:

the focus ring according to claim 9; and a support member that sets said focus ring in a state of surrounding the periphery of the substrate to be processed placed on the mounting table in the process chamber.

11. The focus ring according to claim 9, wherein the interval L1 is 2 to 2.5 mm and the interval L2 is 0.2 to 1 mm.

12. The focus ring according to claim 9, wherein an upper surface of the outer ring portion includes an inclined surface portion disposed around the periphery of the substrate to be processed placed on the mounting table and gradually becoming higher toward an outer side; and a horizontal surface portion formed continuously from and on an outer side of the inclined surface portion.

13. The focus ring according to claim 9, wherein a conductive material forming each of the outer ring portion and the inner ring portion is one of silicon (Si), carbon (C), and silicon carbide (SiC).

14. The focus ring according to claim 9, wherein a capacitance between the substrate to be processed and the first conductive member is changed by changing a dielectric constant of the second insulating member.

15. The focus ring according to claim 1, wherein a first upper face of the first insulating member abuts the a lower face of the first conductive member, a second upper face of the first insulating member abuts a lower face of the second conductive member connecting the first and second inner circumferential surfaces of the second conductive member, and the first upper face of the first insulating member is higher than the second upper face of the first insulating member.

16. The focus ring according to claim 15, wherein an upper face of the second insulating member abuts the lower face of the first conductive member and a lower face of second insulating member abuts an upper face of the second conductive member.

17. The focus ring according to claim 16, further comprising a cover ring provided on an outer circumferential side of the first conductive member, wherein an inner circumferential surface of cover ring abuts an outer circumferential surface of the second insulating member and a lower surface of the cover ring abuts the upper face of the second conductive member.

* * * * *